United States Patent
Eissa et al.

(10) Patent No.: US 10,718,826 B2
(45) Date of Patent: Jul. 21, 2020

(54) HIGH PERFORMANCE FLUXGATE DEVICE

(71) Applicant: Texas Instruments Incorporated, Dallas, TX (US)

(72) Inventors: Mona M. Eissa, Allen, TX (US); Dok Won Lee, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1066 days.

(21) Appl. No.: 14/557,611

(22) Filed: Dec. 2, 2014

(65) Prior Publication Data

US 2016/0154069 A1 Jun. 2, 2016

(51) Int. Cl.
*G01R 33/04* (2006.01)
*G01R 33/00* (2006.01)

(52) U.S. Cl.
CPC ......... *G01R 33/04* (2013.01); *G01R 33/0052* (2013.01)

(58) Field of Classification Search
CPC ..... G01R 33/0052; G01R 33/04; H01L 43/12; H01L 43/02; H01L 27/22; H01L 21/77
See application file for complete search history.

(56) References Cited

U.S. PATENT DOCUMENTS

| | | | | |
|---|---|---|---|---|
| 5,793,272 A | * | 8/1998 | Burghartz | H01F 17/0006 336/200 |
| 6,103,617 A | * | 8/2000 | Yoon | H01L 21/76807 257/E21.579 |
| 8,472,149 B2 | | 6/2013 | Hara et al. | |
| 2002/0085412 A1 | | 7/2002 | Liu et al. | |
| 2002/0196590 A1 | * | 12/2002 | Saito | B82Y 10/00 360/324.11 |
| 2003/0223158 A1 | * | 12/2003 | Sasaki | B82Y 25/00 360/322 |
| 2005/0190509 A1 | | 9/2005 | Fox et al. | |
| 2006/0114094 A1 | * | 6/2006 | Jean | H01F 27/027 336/182 |

(Continued)

FOREIGN PATENT DOCUMENTS

CN 101404319 A 4/2009

OTHER PUBLICATIONS

Wikipedia contributors, "Antiferromagnetism," Wikipedia, The Free Encyclopedia, https://en.wikipedia.org/w/index.php?title=Antiferromagnetism&oldid=841115349 (accessed Jun. 8, 2018).

(Continued)

*Primary Examiner* — Charles D Garber
*Assistant Examiner* — S M Sohel Imtiaz
(74) *Attorney, Agent, or Firm* — Andrew R. Ralston; Charles A. Brill; Frank D. Cimino

(57) ABSTRACT

An integrated circuit includes a fluxgate magnetometer. The magnetic core of the fluxgate magnetometer is encapsulated with a layer of encapsulant of a nonmagnetic metal or a nonmagnetic alloy. The layer of encapsulate provides stress relaxation between the magnetic core material and the surrounding dielectric. A method for forming an integrated circuit has the magnetic core of a fluxgate magnetometer encapsulated with a layer of a nonmagnetic metal or nonmagnetic alloy to eliminate delamination and to substantially reduce cracking of the dielectric that surrounds the magnetic core.

20 Claims, 7 Drawing Sheets

(56) References Cited

U.S. PATENT DOCUMENTS

| | | | |
|---|---|---|---|
| 2006/0138576 A1* | 6/2006 | Galdis | G11C 11/16 257/421 |
| 2008/0014739 A1* | 1/2008 | Matz | H01L 21/76832 438/622 |
| 2009/0067088 A1* | 3/2009 | Albertini | G11B 5/31 360/121 |
| 2009/0068761 A1 | 3/2009 | Lotfi et al. | |
| 2013/0069252 A1* | 3/2013 | Han | H01L 31/1876 257/787 |
| 2013/0141082 A1* | 6/2013 | Zhou | G01D 5/2033 324/207.13 |
| 2014/0167193 A1* | 6/2014 | Iuliano | G01R 33/0052 257/427 |
| 2014/0347047 A1* | 11/2014 | Fu | G01R 33/09 324/252 |
| 2015/0034476 A1* | 2/2015 | Cerio | C23C 14/0635 204/192.2 |
| 2015/0097254 A1* | 4/2015 | Ohmori | H01L 43/08 257/421 |

OTHER PUBLICATIONS

Search Report for Application No. 201510869776.1, dated Mar. 16, 2020.

English Translation Search Report for Application No. 201510869776.1, dated Mar. 16, 2020.

\* cited by examiner

HIGH PERFORMANCE FLUXGATE DEVICE

FIELD OF THE INVENTION

This invention relates to the field of integrated circuits. More particularly, this invention relates to fluxgate magnetometers in integrated circuits.

BACKGROUND OF THE INVENTION

An integrated circuit has a fluxgate magnetometer. Integrating the fluxgate magnetometer into the integrated circuit fabrication process requires forming magnetic cores of high permeability material such as permalloy (NiFe). The magnetic cores may be large (greater than 100 microns in width and length) and may apply high stress to the integrated circuit. The high stress may cause delamination and cracks in the integrated circuit that degrade yield. Integrating such a fluxgate magnetometer typically imposes limitations on the size and/or thickness of the magnetic core to avoid yield loss due to delamination and cracking.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes a fluxgate magnetometer. The magnetic core of the fluxgate magnetometer is encapsulated with a layer of nonmagnetic metal or alloy. The layer of nonmagnetic metal or nonmagnetic alloy provides stress relaxation between the magnetic core material and the surrounding dielectric. The layer of nonmagnetic metal or nonmagnetic alloy prevents delamination and substantially reduces cracking of the dielectric surrounding the magnetic core due to stress.

DETAILED DESCRIPTION OF EXAMPLE EMBODIMENTS

The following co-pending patent application is related and hereby incorporated by reference: U.S. patent application Ser. No. 14/557,546. With its mention in this section, this patent application is not admitted to be prior art with respect to the present invention.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit with a fluxgate magnetometer may be formed to include a magnetic core that is encapsulated in a nonmagnetic metal such as Ti, Ta, Ru, and Pt or a nonmagnetic alloy such as TiN, TaN or AlN. Encapsulation of the magnetic core in a nonmagnetic metal such as Ti, Ta, Ru, and Pt or a nonmagnetic alloy reduces stress and prevents delamination. In addition, encapsulation of the magnetic core in a nonmagnetic metal or a nonmagnetic alloy significantly reduces and almost eliminates stress cracking. Cracks that may form are small and do not adversely impact yield. Encapsulation of the magnetic core enables magnetic cores with larger dimensions (length, width, and thickness) to be formed in the integrated circuit. Titanium metal is used as the encapsulating layer in the following description for illustration purposes, but it is understood that Ta, Ru, Pt, TiN, TaN, and AlN may be used instead of the titanium.

The term nonmagnetic metal refers to Ti, Ta, Ru, and Pt metals.

The term nonmagnetic alloy refers to TiN, TaN, and AlN.

Figure 1:
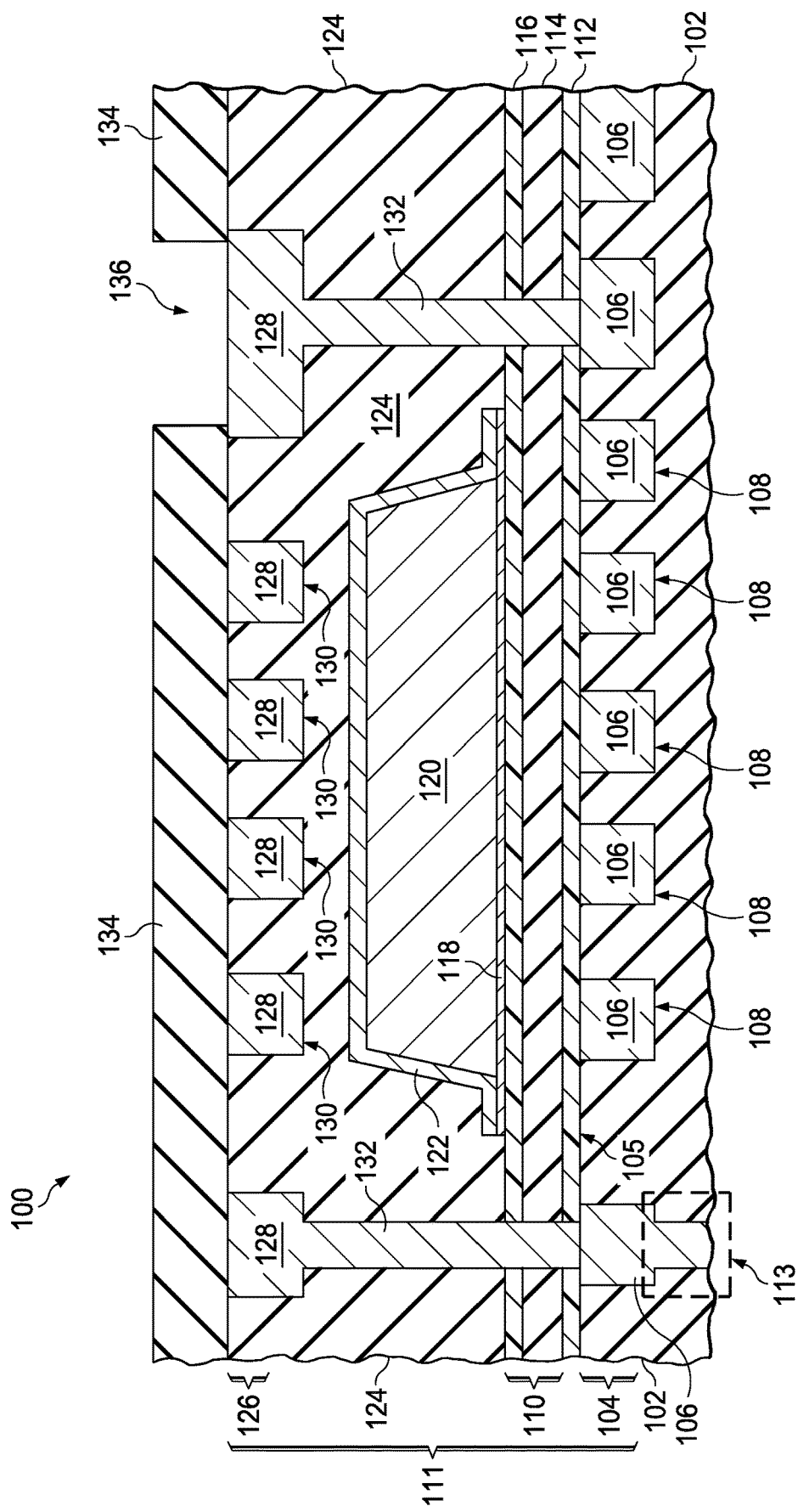
FIG. 1 is a cross section of an example integrated circuit containing a fluxgate magnetometer.

FIG. 1 is a cross section of an example integrated circuit containing a fluxgate magnetometer 111. The fluxgate magnetometer is comprised of the magnetic core 120 surrounded by a metal coil comprised of first metal lines 104 underlying the magnetic core 120 and second metal lines 126 overlying the magnetic core 120 and connected together with vias 132. The integrated circuit 100 includes a first interlevel dielectric (ILD) layer 102 which may include silicon dioxide-based material, such as organosilicate glass (OSG), silicon nitride or silicon oxynitride, and/or a low dielectric constant (low-k) dielectric. A plurality of first metal lines 104 having copper damascene structures are disposed in the first ILD layer 102, extending to a top surface 105 of the first ILD layer 102. Each instance of the first metal lines 104 includes a refractory metal liner (not shown) of tantalum and/or tantalum nitride, and a fill metal 106 of copper on the metal liner. One or more of the first metal lines 104 may be connected to first vias 113 having copper damascene structures, disposed in the first ILD layer 102. The first metal lines 104 and first vias 113 may be dual damascene structures as depicted in FIG. 1, or may be single damascene structures.

A dielectric layer 110 is disposed on the first ILD layer 102 and on the first metal lines 104. The dielectric layer 110 may be 500 to 1000 nm thick. The dielectric layer 110 may include a first etch stop layer 112 over the first ILD layer 102 and over the first metal lines 104. The first etch stop layer 112 may be primarily silicon nitride-based dielectric material, 50 nanometers to 150 nanometers thick, which advantageously reduces copper migration from the first metal lines 104. Dielectric layer 114 may be a silicon dioxide layer 500 to 800 nm thick formed by plasma enhanced chemical vapor deposition (PECVD) using tetraethyl orthosilicate, also known as tetraethoxysilane (TEOS). A second etch stop layer 116 is formed over the silicon dioxide layer 114. The second etch stop layer 116 may be primarily a silicon nitride-based dielectric material, 50 nanometers to 150 nanometers thick, and provides an etch stop for the subsequent magnetic core titanium encapsulation etching step.

A first encapsulation layer 118 with a thickness of about 30 to 50 nm is disposed on top of the second etch stop layer 116 and under the magnetic core 120. The first encapsulation layer 118 extends past the magnetic core 120 by at least about 1.5 microns. The first encapsulation layer 118 comprises a non-magnetic metal or a nonmagnetic alloy. In one example, first encapsulation layer 118 comprises Ti. The magnetic core material is a soft magnetic alloy including NiFe-based alloys such as permalloy and NiFeMo and CoZr based alloys such as CoNbZr and CoTaZr. The magnetic core may also be a laminate structure composed of alternating layers of the soft magnetic alloy and a thin layer of dielectric such as aluminum nitride (AlN), aluminum oxide ($Al_2O_3$), or silicon dioxide ($SiO_2$). In an example fluxgate magnetometer the magnetic core 120 is a laminate structure comprised of alternating layers of permalloy with a thickness in the range of about 225 nm to 425 nm and AlN with a thickness in the range of about 6 to 12 nm. The fluxgate magnetometer may have between 3 to 10 layers of the permalloy plus dielectric. In an example fluxgate magnetometer the magnetic core 120 has eight layers with a thickness of about 1.5 um. The top layer in the magnetic core 120 laminate may be the soft magnetic alloy or may be the thin layer of dielectric (AlN).

A second encapsulation layer 122 with a thickness of about 90 nm to 300 nm is disposed over the magnetic core 120 and covers the top and the sides of the magnetic core 120. The second encapsulation layer 122 also extends past the magnetic core 120 by at least about 1.5 microns. The first encapsulation layer 118 and the second encapsulation layer 122 extend past the magnetic core 120 by the same distance. The first encapsulation layer 118 which is disposed under the magnetic core 120 plus the second encapsulation layer 122 which is disposed over the top and sides of the magnetic core 120 completely encapsulates the magnetic core 120. In an example flux gate magnetometer the first 118 and second 122 encapsulation layers extend past the magnetic core 120 by about 2 microns.

A second ILD layer 124 is disposed over the dielectric layer 110 and over the first encapsulation layer 118, the magnetic core 120, and the second encapsulation layer 122. The thickness of the second ILD layer 124 depends upon the thickness of the magnetic core 120. In an example fluxgate magnetometer the thickness of the second ILD layer 124 is about 3.5 microns of silicon dioxide deposited using a PECVD TEOS process.

A plurality of second vias 132 having copper damascene structures are disposed in the second ILD layer 124. Some of the second vias 132 extend through the dielectric layer 110 and make connections to the first metal lines 104. The second vias 132 may be part of dual damascene structures which include second metal lines 128 over the second vias 132, as depicted in FIG. 1. Alternatively, the second vias 132 may be single damascene structures. The integrated circuit 100 may include an protective overcoat layer 134 disposed over the second ILD layer 124 and over the second metal lines 128 with a bond pad opening 136 as shown in FIG. 1. Alternatively the integrated circuit may include a third etch stop layer disposed over the second ILD layer 124 and second metal lines 128 and possibly a third ILD layer over the third etch stop layer.

The second metal leads 130 above the magnetic core 120 are connected to the first metal leads 108 under the magnetic core 120 by a first set of second vias 132 disposed in front of the magnetic core 120 and by a second set of second vias 132 disposed behind the magnetic core 120. These second vias 132 connect the first metal leads 108 to the second metal leads 130 to form a coil 212 (in FIG. 2) which surrounds the magnetic core 214. The first metal leads 108 may be connected to the second metal leads 130 to form more than one coil surrounding the magnetic core 120. The coils are electrically isolated from the magnetic core 120 by the first dielectric layer 110 and second ILD dielectric 124.

Figure 2:
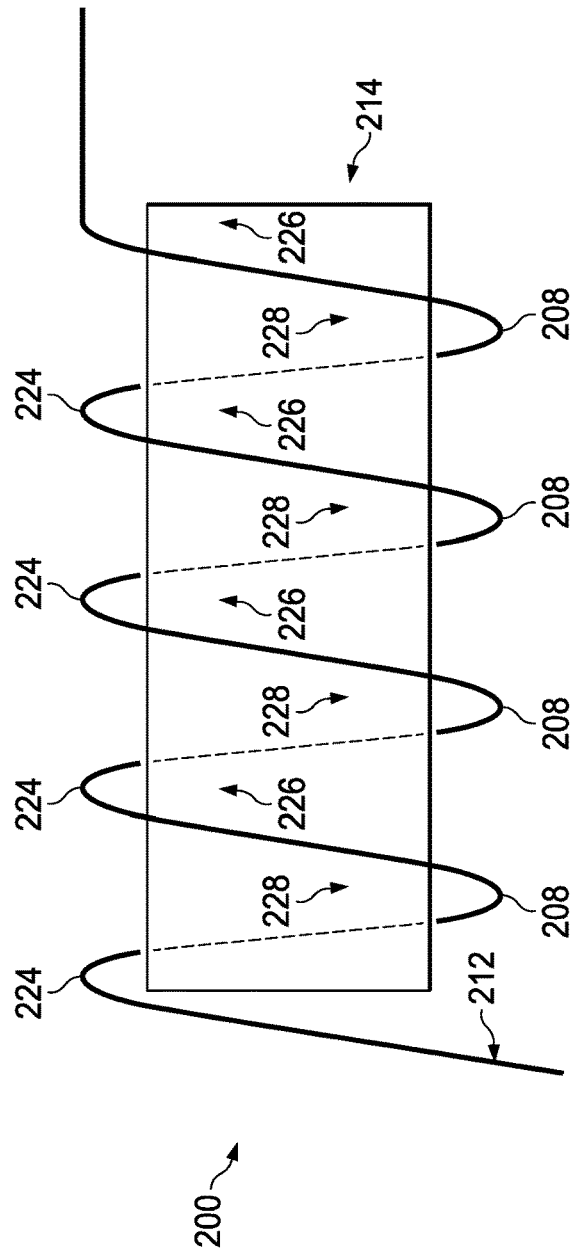
FIG. 2 is a diagram of a fluxgate magnetometer.

As is additionally illustrated in FIG. 2, first metal leads 208 underlying the magnetic core 214 are connected to the second metal leads 224 overlying the magnetic core 214 by vias 226 in front of the magnetic core 214 and by vias 228 behind the magnetic core 214. Although only one coil 212 is shown, two or more coils are typically formed around the magnetic core 214 to form the fluxgate magnetometer 200.

Figure 3A:
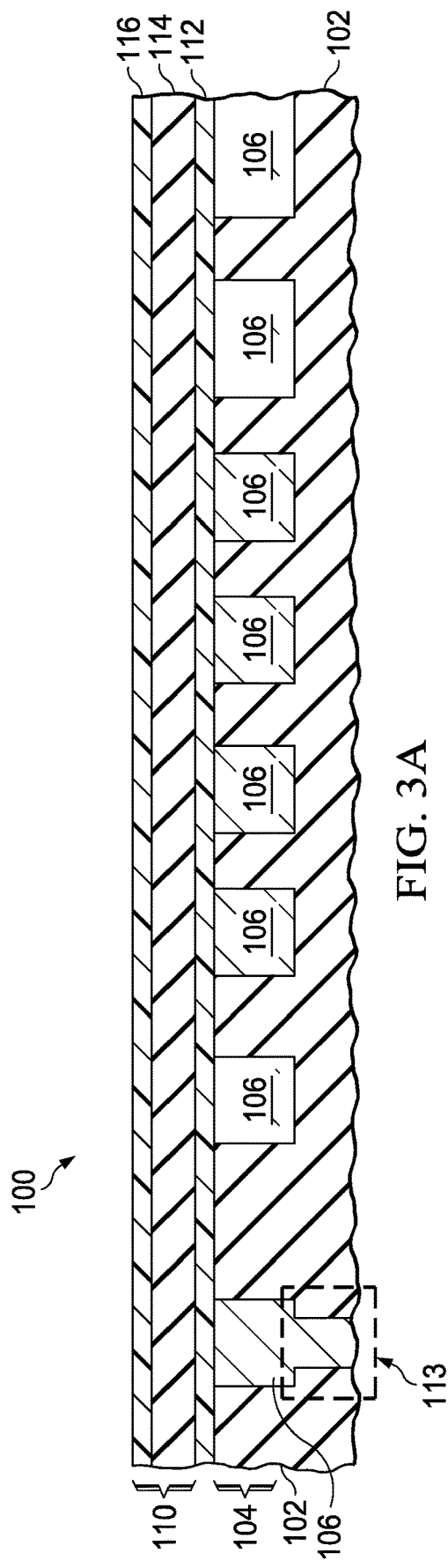
FIG. 3A through FIG. 3F are cross sections of the integrated circuit of FIG. 1 depicted in successive stages of fabrication.

FIG. 3A through FIG. 3F are cross sections of the integrated circuit of FIG. 1 depicted in successive stages of fabrication. Referring to FIG. 3A, a dielectric layer 110 is formed over lower layers 102 and a substrate of the integrated circuit 100.

Referring to FIG. 3A, the first etch stop layer 112 is formed in the dielectric layer 110. The first etch stop layer 112 may be silicon nitride and may be formed by PECVD using silane, ammonia and nitrogen gases, to provide desired etch selectivity to subsequently formed overlying layers of silicon dioxide-based dielectric materials. The first etch stop layer 112 also advantageously provides a diffusion barrier to copper 106 in the underlying first metal leads 104.

A second layer 114 in the dielectric layer 110 may be a silicon dioxide-based dielectric material about 500 nm to about 1000 nm thick formed PECVD using TEOS, or another suitable process.

The third layer in the dielectric layer 110 is a second etch stop layer 116. The second etch stop layer 116 may be silicon nitride with a thickness between about 35 nm to 150 nm formed by PECVD using silane, ammonia and nitrogen gases, to provide desired etch selectivity to a subsequent plasma titanium etch.

Figure 3B:
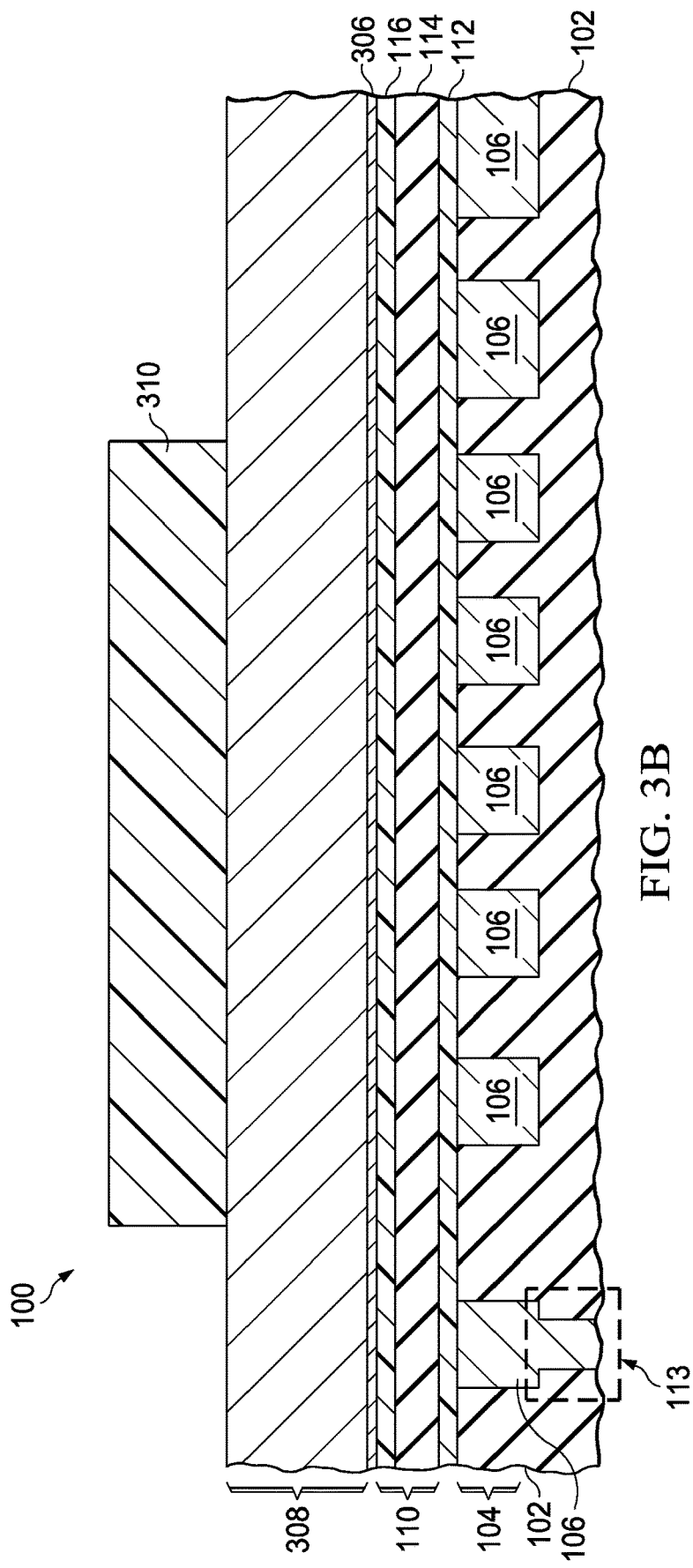

Referring to FIG. 3B a first encapsulation layer of, for example, titanium 306 is deposited on etch stop layer 116. The first titanium layer 306 may have a thickness in the range of about 30 to 50 nm and may be deposited by physical vapor deposition (PVD) techniques such as sputtering or chemical vapor deposition (CVD) techniques. The titanium has the advantage of providing stress relief between the underlying dielectric layer 110 and the subsequently deposited magnetic core material 308. This eliminates delamination of the magnetic core material 308 and significantly reduces cracks that may be formed in the underlying dielectric layer 110 due to stress. In addition, when NiFe permalloy is used in the magnetic core, the first titanium layer 306 provides a surface for grain growth which is beneficial for fluxgate electrical properties.

Magnetic core material 308 is deposited onto the first titanium layer 306. The thickness of the magnetic core material 308 depends upon the specifications of the fluxgate magnetometer being formed. In an example fluxgate magnetometer the magnetic core material 308 is a multi-layer laminate stack of permalloy and AlN with a thickness of about 1.5 microns. Other materials, such as those discussed above with reference to FIG. 1 may alternatively be used. A magnetic core pattern 310 is formed over the magnetic core material layer 308 and exposes the magnetic core material layer 308 where it is to be etched away. The magnetic core pattern 310 may include photoresist formed by a photolithographic process, and may possibly include an anti-reflection layer and/or a hard mask layer.

Figure 3C:
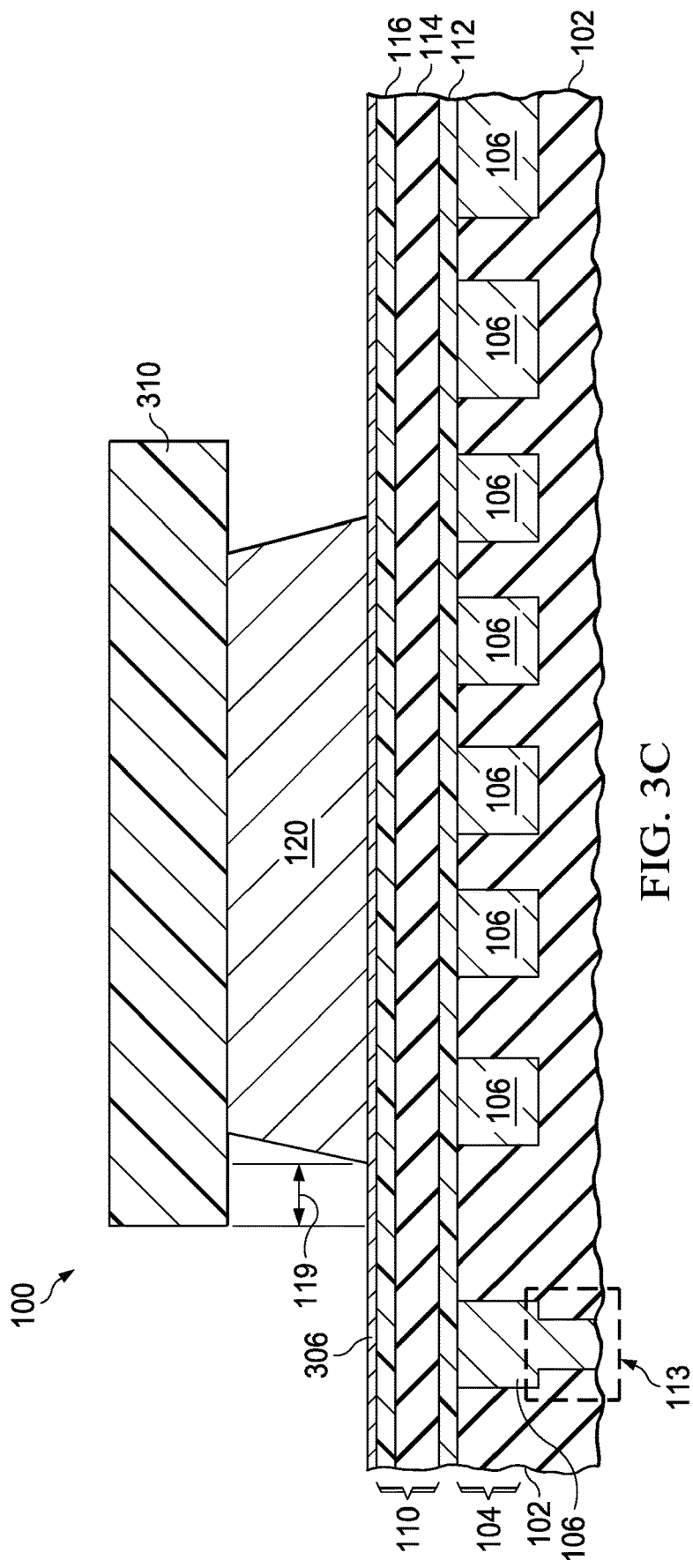

Referring to FIG. 3C, the magnetic core material layer 308 of FIG. 3B is etched from the regions exposed by the magnetic core pattern 310 to form the magnetic core 120. The magnetic core material 308 may be etched using a plasma etch or may be wet etched. The etch chemistry depends upon the magnetic core material. The magnetic core material 308 is overetched so that the magnetic core pattern 310 extends past the bottom of the magnetic core 120 by a distance 119 of at least about 1.5 microns. In an example fluxgate magnetometer the magnetic core material 308 is a multilayer laminate of permalloy and AlN and is etched with wet etchant containing phosphoric acid, acetic acid, and nitric acid.

Figure 3D:
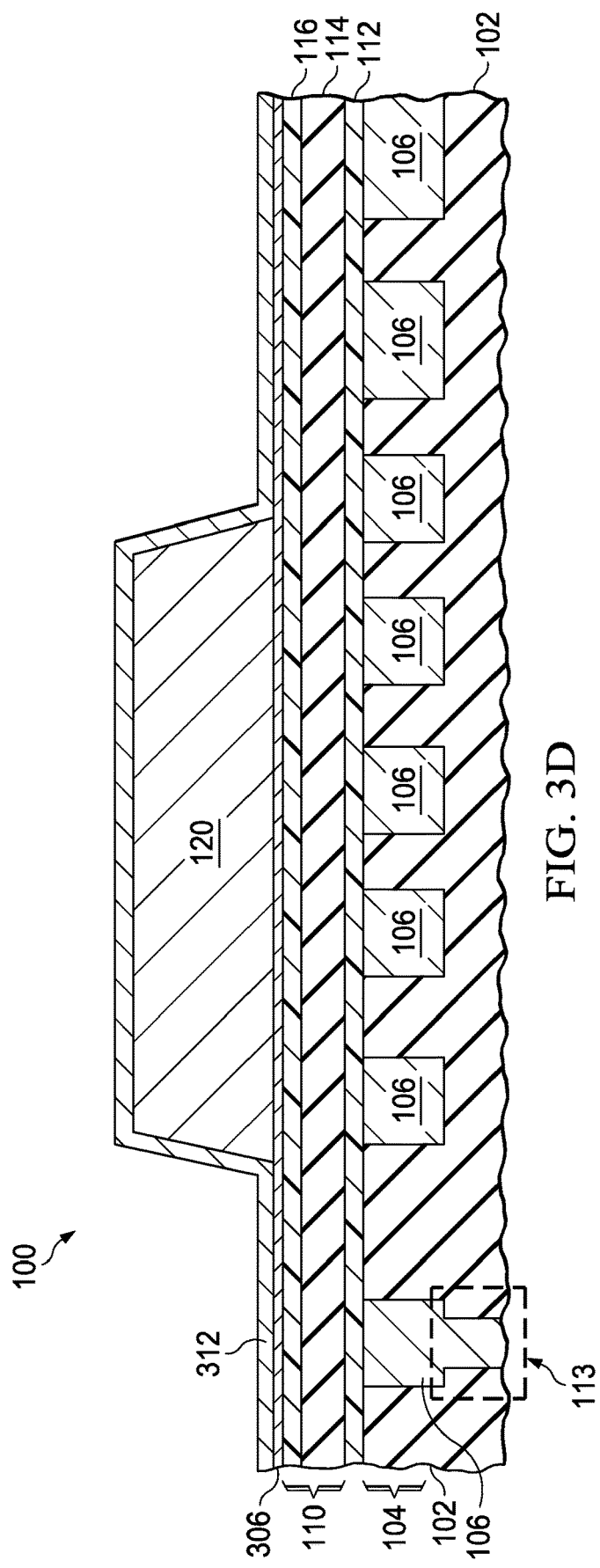

Referring to FIG. 3D, the magnetic core pattern 310 of FIG. 3C is removed and a second encapsulation layer of, for example, titanium layer 312 is deposited over the magnetic core 120 and over the first titanium layer 306. The second titanium layer 312 may have a thickness in the range of about 90 nm to 300 nm and may be deposited by physical vapor deposition (PVD) techniques such as sputtering or chemical vapor deposition (CVD) techniques. The second titanium layer 312 has the advantage of providing stress relief between the magnetic core 120 and subsequently deposited dielectric layers. This eliminates delamination and significantly reduces cracks that may form in surrounding dielectric layers due to stress.

Figure 3E:
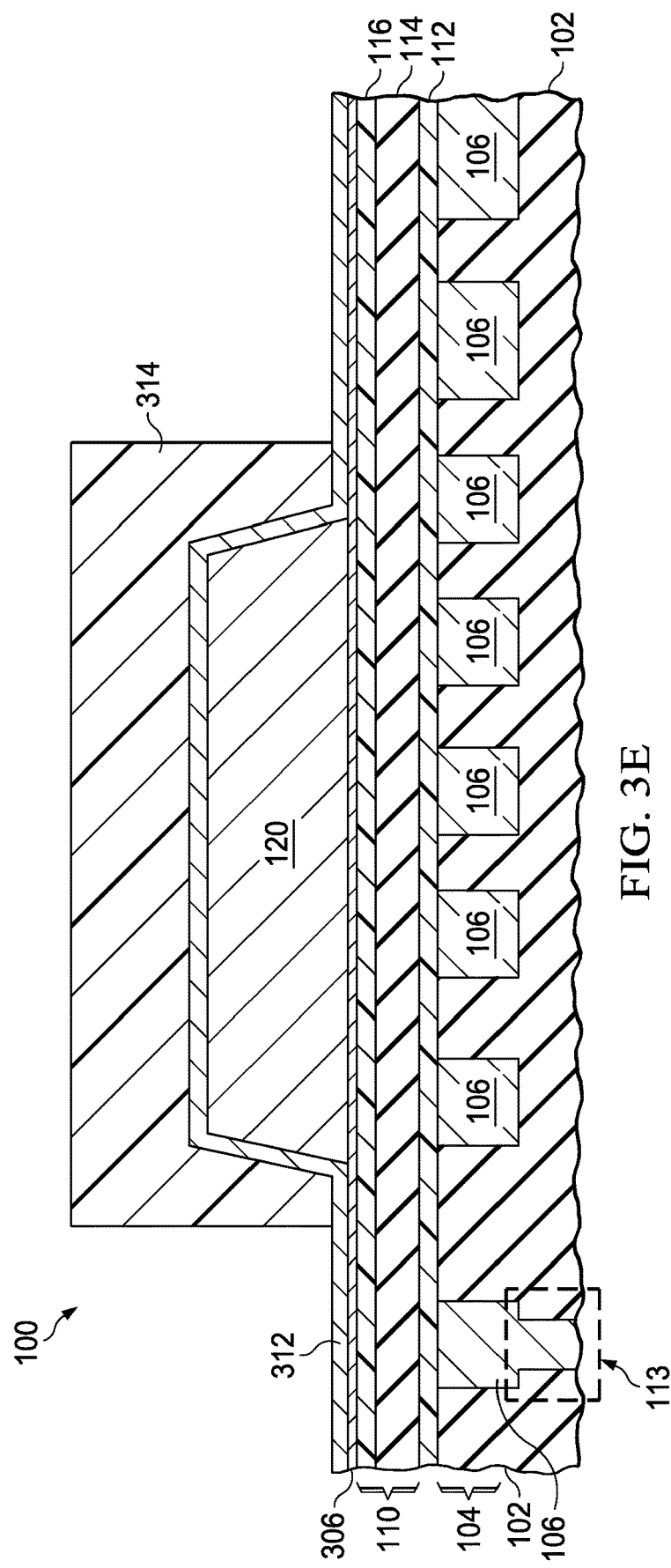

Referring to FIG. 3E, an encapsulation etch pattern 314 is formed over the magnetic core 120 and extends at least about 1.5 microns on all sides past the magnetic core 120. The encapsulation etch pattern 314 exposes the second encapsulation titanium layer 312 and first encapsulation titanium layer 306 outside of the magnetic core 120 region.

Figure 3F:
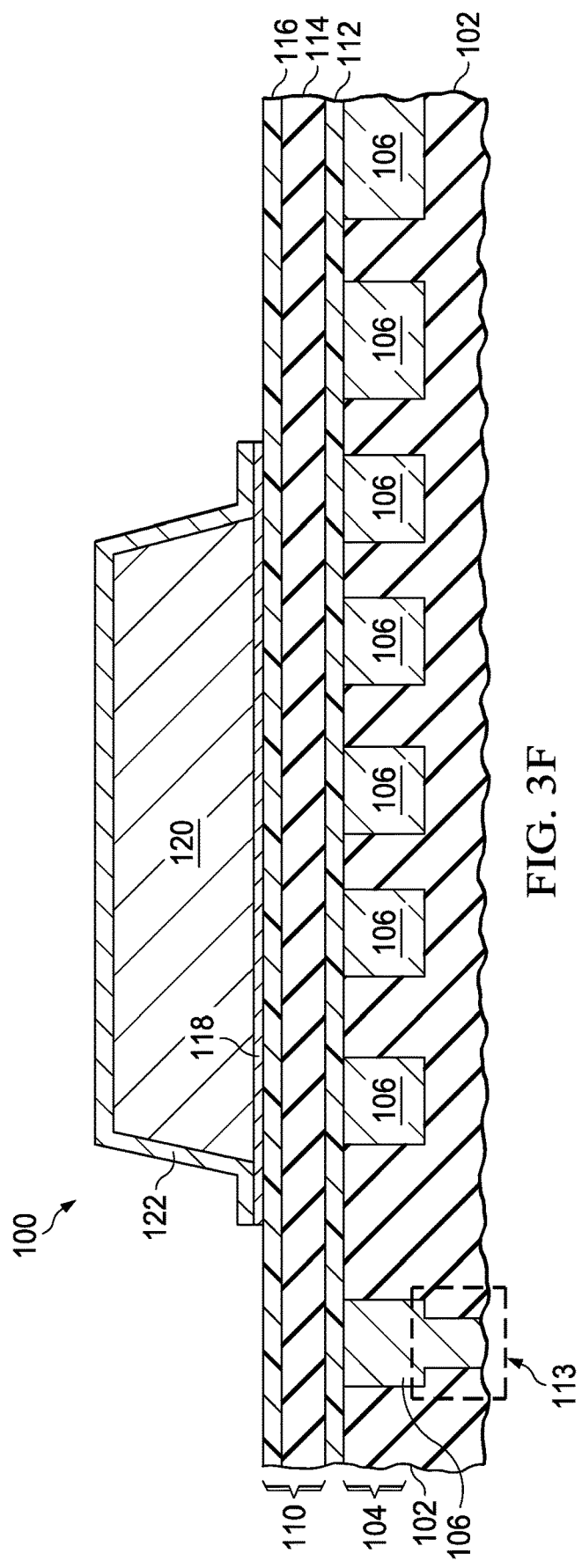

As shown in FIG. 3F, the second titanium layer 312 of FIG. 3E exposed by the encapsulation etch pattern 314 is etched away to form second encapsulation layer 122. The second titanium layer 312 may be etched by plasma etching with a fluorine containing gas. The portion of the second encapsulation layer 122 disposed over the magnetic core 120 and protected by the encapsulation etch pattern 314 of FIG. 3E remains and encapsulates the top and sides of the magnetic core 120. The first titanium layer 306 of FIG. 3E exposed by the encapsulation etch pattern 314 of FIG. 3E is also etched away to form first encapsulation layer 118. The portion of the first encapsulation layer 118 protected by the encapsulation etch pattern 314 and the magnetic core 120 remains and encapsulates the bottom of the magnetic core 120. The first 118 and second 122 encapsulation layers extend past the magnetic core 120 about 1.5 to 3 microns. The titanium encapsulation provides stress relief between the magnetic core 120 and surrounding dielectric layers and prevents delamination of the magnetic core 120. In addition it almost eliminates stress cracking in dielectric layers that surround the magnetic core 120.

Fabrication of the integrated circuit 100 is continued to provide the fluxgate magnetometer structure of FIG. 1.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a first dielectric layer comprising a first dielectric material; and
    a fluxgate with a magnetic core wherein the magnetic core is encapsulated on all sides by a layer of encapsulant, wherein the encapsulant is comprised of a first layer of a nonmagnetic metal or a nonmagnetic alloy under the magnetic core and a second layer of the nonmagnetic metal or nonmagnetic alloy over the top and sides of the magnetic core;
    wherein the magnetic core and the encapsulant are disposed in the first dielectric layer and the first dielectric material is disposed on a surface of the second layer of the encapsulant and separated from the magnetic core by the second layer of the encapsulant.

2. The integrated circuit of claim 1, wherein the nonmagnetic metal is selected from the group consisting of Ti, Ta, Ru, and Pt and wherein the nonmagnetic alloy is selected from the group consisting of TiN, TaN, and AlN.

3. The integrated circuit of claim 1, wherein the magnetic core comprises a magnetic core material that is selected from the group consisting of permalloy, NiFeMo, CoNbZr, and CoTaZr.

4. The integrated circuit of claim 3, wherein the magnetic core is a multilayered stack of alternating layers of magnetic core material and a dielectric selected from the group consisting of aluminum oxide, silicon dioxide, and aluminum nitride.

5. The integrated circuit of claim 4, wherein the multilayered stack is comprised of 3 to 10 layers of permalloy with a thickness in the range of 225 nm to 425 nm and 3 to 10 layers of AlN with a thickness in the range of 6 to 12 nm.

6. The integrated circuit of claim 5, wherein aluminum nitride is the top layer of the multilayered stack.

7. The integrated circuit of claim 1, wherein the first layer of the encapsulant is disposed under the magnetic core extending past the magnetic core by at least 1.5 microns on all sides and the second layer of the encapsulant is disposed over the top and sides of the magnetic core and extending past the magnetic core by at least 1.5 microns on all sides.

8. The integrated circuit of claim 7, wherein the first layer has a thickness in the range of 30 nm to 50 nm and wherein the second layer has a thickness in the range of 90 nm to 300 nm.

9. The integrated circuit of claim 1, wherein the first dielectric material comprises silicon dioxide.

10. The integrated circuit of claim 1, comprising a second dielectric layer, wherein the first dielectric layer is disposed over the second dielectric layer, and the first layer of the encapsulant is disposed on a surface of the second dielectric layer.

11. The integrated circuit of claim 10, wherein the second dielectric layer comprises a first etch stop layer, a second etch stop layer, and a second dielectric material disposed between the first and second etch stop layers.

12. The integrated circuit of claim 11, wherein the first and second etch stop layers comprise silicon nitride.

13. The integrated circuit of claim 10, comprising a third dielectric layer, wherein the second dielectric layer is disposed over the third dielectric layer.

14. The integrated circuit of claim 13, wherein the fluxgate comprises:
    first metal lines in the third dielectric layer; and
    second metal lines in the first dielectric layer, wherein at least one of the first metal lines is electrically connected to at least one of the second metal lines by at least one via extending through the first and second dielectric layers.

15. The integrated circuit of claim 14, wherein the first metal lines, second metal lines, and the at least one via form at least one coil disposed around the magnetic core, the at least one coil being electrically isolated from the magnetic core by the first electric layer and the second dielectric layer.

16. An integrated circuit, comprising:
   a first titanium layer;
   a magnetic core disposed on the first titanium layer, wherein the first titanium layer extends at least 1.5 microns beyond the magnetic core on all sides, and wherein the magnetic core is comprised of a laminate structure having 3 to 10 layers each of NiFe and AlN, the layers of NiFe and AlN being arranged as alternating layers;
   a second titanium layer disposed on a top and sides of the magnetic core and extending at least 1.5 microns beyond the magnetic core on all sides; and
   a first interlevel dielectric layer comprising a first dielectric material disposed on a surface of the first titanium layer and on a surface of the second titanium layer but not on any surface of the magnetic core.

17. The integrated circuit of claim 16, wherein the first titanium layer has a thickness between 30 and 50 nm and wherein the second titanium layer has a thickness between 90 and 300 nm.

18. The integrated circuit of claim 16 where the first titanium layer and the second titanium layer extend 2 microns beyond the magnetic core on all sides.

19. The integrated circuit of claim 16, comprising:
   a second interlevel dielectric layer comprising a second dielectric material and first metal lines, the first interlevel dielectric layer being disposed over the second interlevel dielectric layer;
   wherein the first interlevel dielectric layer comprises second metal lines formed over the second titanium layer and isolated therefrom by the first dielectric material, and at least one of the second metal lines is electrically connected to at least one of the first metal lines by a via to form a coil around the magnetic core.

20. The integrated circuit of claim 19, wherein the via and the at least one of the second metal lines form a dual damascene structure.

* * * * *